United States Patent
Wang et al.

(10) Patent No.: US 7,642,152 B2
(45) Date of Patent: Jan. 5, 2010

(54) METHOD OF FABRICATING SPACERS AND CLEANING METHOD OF POST-ETCHING AND SEMICONDUCTOR DEVICE

(75) Inventors: Chuan-Kai Wang, Shanhua Township, Tainan County (TW); Yi-Hsing Chen, Changhua (TW); Chia-Jui Liu, Yangmei Township, Taoyuan County (TW); Juan-Yi Chen, Chiai (TW); Ming-Yi Lin, Keelung (TW)

(73) Assignee: United Microelectronics Corp., Hsinchu (TW)

( * ) Notice: Subject to any disclaimer, the term of this patent is extended or adjusted under 35 U.S.C. 154(b) by 271 days.

(21) Appl. No.: 11/221,611

(22) Filed: Sep. 7, 2005

(65) Prior Publication Data

US 2007/0054458 A1   Mar. 8, 2007

(51) Int. Cl.
*H01L 21/8238* (2006.01)
*H01L 21/336* (2006.01)
*H01L 21/31* (2006.01)

(52) U.S. Cl. .................. 438/230; 438/303; 438/770; 438/788; 438/976; 257/E21.282; 257/E21.279

(58) Field of Classification Search ............... 438/230, 438/303, 770, 788, 798, 911, 976, 776; 257/E21.279
See application file for complete search history.

(56) References Cited

U.S. PATENT DOCUMENTS

| | | | | |
|---|---|---|---|---|
| 5,814,563 A | * | 9/1998 | Ding et al. | 438/714 |
| 5,849,640 A | * | 12/1998 | Hsia et al. | 438/734 |
| 6,521,529 B1 | * | 2/2003 | Ngo et al. | 438/664 |
| 2005/0161434 A1 | * | 7/2005 | Sugawara et al. | 216/67 |
| 2006/0057853 A1 | * | 3/2006 | Mehrotra et al. | 438/706 |

FOREIGN PATENT DOCUMENTS

CN   1400638   3/2003

* cited by examiner

*Primary Examiner*—Walter L Lindsay, Jr.
*Assistant Examiner*—Ron Pompey
(74) *Attorney, Agent, or Firm*—J.C. Patents

(57) ABSTRACT

A method of fabricating spacers is provided. The method includes providing a substrate with a device structure formed thereon. The device structure comprises a gate structure and a pair of source/drain regions. Then, a spacer material layer is formed over the substrate to cover the substrate and the device structure. Thereafter, an etching process is performed to remove a portion of the spacer material layer so that spacers are formed on the respective sidewalls of the gate structure. After that, a plasma treatment step is performed to form a spacer protection layer on the surface of the substrate, the spacers and the gate structure.

15 Claims, 2 Drawing Sheets

METHOD OF FABRICATING SPACERS AND CLEANING METHOD OF POST-ETCHING AND SEMICONDUCTOR DEVICE

BACKGROUND OF THE INVENTION

1. Field of the Invention

The present invention relates to a semiconductor device and fabrication process. More particularly, the present invention relates to a method of fabricating spacers and its post-etching cleaning and semiconductor device.

2. Description of the Related Art

In the conventional method of fabricating a metal oxide semiconductor (MOS) transistor, spacers are often formed on the respective sidewalls of the gate to increase the degree of isolation between the source/drain regions and the gate. More importantly, the entire structure including the spacers and the gate can be utilized to form the source/drain regions in a doping step.

In general, the process of fabricating the gate spacers includes sequentially forming a gate oxide layer and a polysilicon layer over a semiconductor substrate. Then, the gate oxide layer and the polysilicon layer are defined to form a gate structure. Thereafter, a silicon nitride layer is formed to cover the entire gate structure. After that, an etching process is performed to form silicon nitride spacers on the respective sidewalls of the gate structure. After performing the spacer etching process and before carrying out a subsequent process, the entire wafer will be immersed in a rinsing tank to perform a cleaning step so that any micro particles and post-etching residual polymer attached to the substrate are removed.

However, the chemical cleaning solution in the rinsing operation frequently leads to some damages to the surface of the spacers and the attrition of the spacer film layer resulting in a reduction of the width of the spacers. Ultimately, the short channel effect will be amplified and gate-source/drain capacitance value will be increased. Furthermore, the cleaning step also leads to a slight problem in controlling the width of the spacers.

SUMMARY OF THE INVENTION

Accordingly, the present invention is directed to a method of fabricating spacers. According to this method, this method capable of protecting the spacers and preventing any damage and attrition to the surface of the film layers that lead to a reduction in thickness of the spacers.

The present invention is directed to a cleaning method of post spacer-forming etching process. According to this method, the width of the spacers can be more readily controlled.

The present invention is directed to a semiconductor device According to this semiconductor device, this semiconductor device having a spacer protection layer to protect the spacers against unwanted damages and attrition.

To achieve these and other advantages and in accordance with the purpose of the invention, as embodied and broadly described herein, the invention provides a method of fabricating spacers. The method includes providing a substrate having a device structure formed thereon. The device structure comprises a gate structure and a pair of source/drain regions. Then, a spacer material layer is formed over the substrate to cover the substrate and the device structure. Thereafter, an etching process is performed to remove a portion of the spacer material layer to form spacers on the respective sidewalls of the gate structure. After that, a plasma treatment step is performed to form a spacer protection layer on the surface of the substrate, the spacers and the device structure.

According to the embodiment of the present invention, the reactive gas used in the plasma treatment step includes, for example, an oxygen-containing gas. The oxygen-containing gas comprises oxygen and another gas selected from the group consisting of nitrogen ($N_2$), argon (Ar), neon (Ne) and helium (He). The reaction time in the plasma treatment step is set between 20 to 40 seconds.

According to the embodiment of the present invention, the spacer protection layer is an oxide layer, for example. Furthermore, the spacer material layer is fabricated using silicon nitride, for example.

According to the embodiment of the present invention, the gaseous etchant in the etching process is a mixture containing carbon hexafluoride/carbon dioxide/fluoromethane ($C_2F_6$/$CO_2$/$CH_3F$).

According to the embodiment of the present invention, the etching process and the plasma treatment step are performed in the same reaction chamber, for example.

The present invention also provide a cleaning method after performing an etching process to form spacers. The method includes providing a substrate having a device structure formed thereon. The device structure comprises a gate structure and a pair of source/drain regions. Furthermore, spacers are formed on the respective sidewalls of the gate structure. Then, a plasma treatment step is performed to form a spacer protection layer on the surface of the substrate, the spacers and the device structure. Thereafter, the substrate, the spacers and the device structure are cleaned at least once in a cleaning step.

According to the embodiment of the present invention, the reactive gas used in the plasma treatment step includes, for example, an oxygen-containing gas. The oxygen-containing gas comprises oxygen and another gas selected from the group consisting of nitrogen, argon, neon and helium. The reaction time in the plasma treatment step is set between 20 to 40 seconds.

According to the embodiment of the present invention, the spacer protection layer is an oxide layer, for example. Furthermore, the spacer material layer is fabricated using silicon nitride, for example.

According to the embodiment of the present invention, the gaseous etchant in the etching process is a mixture containing carbon hexafluoride/carbon dioxide/fluoromethane.

According to the embodiment of the present invention, the etching process and the plasma treatment step are performed in the same reaction chamber, for example.

According to the embodiment of the present invention, the cleaning solution in the aforementioned cleaning step can be a solution mixture of sulfuric acid ($H_2SO_4$)/hydrogen peroxide ($H_2O_2$)/water ($H_2O$) (standard cleaning solution SPM), a solution mixture of hydrochloric acid (HCl)/hydrogen peroxide ($H_2O_2$)/water ($H_2O$) (standard cleaning solution HPM) or a solution mixture of ammonium water ($NH_4OH$)/hydrogen peroxide ($H_2O_2$)/water ($H_2O$) (standard cleaning solution APM).

The present invention also provides a semiconductor device. The semiconductor device comprises a device structure, a plurality of spacers and a spacer protection layer. The device structure comprises a gate structure and a pair of source/drain region. The gate structure is disposed on the substrate and the source/drain regions are disposed in the substrate on the respective side of the gate structure. Furthermore, the spacers are disposed on the respective sidewalls of the gate structure. The spacer protection layer is disposed on the surface of the substrate, the spacers and the device structure.

According to the embodiment of the present invention, the aforementioned spacers are fabricated using silicon nitride, for example. The spacer protection layer is fabricated using oxide material, for example.

In the present invention, a plasma treatment step is performed to form a spacer protection layer for protecting the spacers after forming the spacers in an etching process. Furthermore, because a spacer protection layer is formed over all the spacers, the surface of the spacers is protected against any damages and the thinning of the spacers due to attrition is prevented after a subsequent cleaning step. In addition, with the formation of a spacer protection layer in a plasma treatment step after forming the spacers in an etching process, the queuing time (Q-time) in the cleaning step can be increased to reduce production cost.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
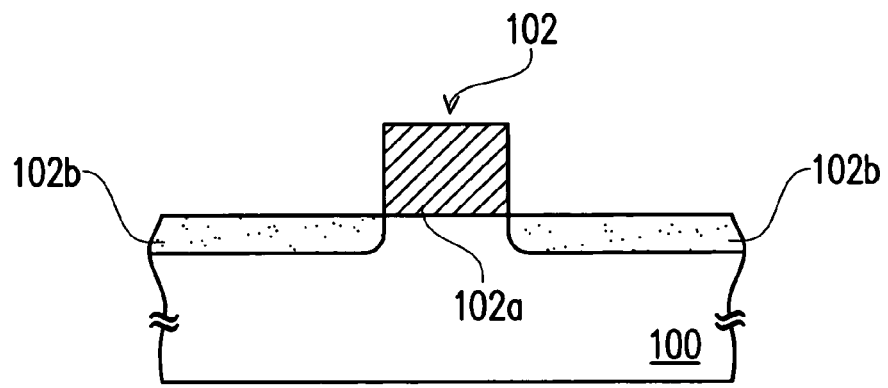
FIG. 1A through 1D are schematic cross-sectional view showing the steps for fabricating spacers according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1D are schematic cross-sectional views showing the steps for fabricating spacers according to one embodiment of the present invention.

Referring to FIG. 1A, a device structure 102 is formed over a substrate 100. The substrate 100 is a silicon substrate and the device structure 102 comprises a gate structure 102a and a pair of source/drain regions 102b, for example. Since the device structure 102 is formed using conventional material in a conventional method that should be familiar to those technicians skilled in this area, a detailed description is omitted.

Figure 1B:
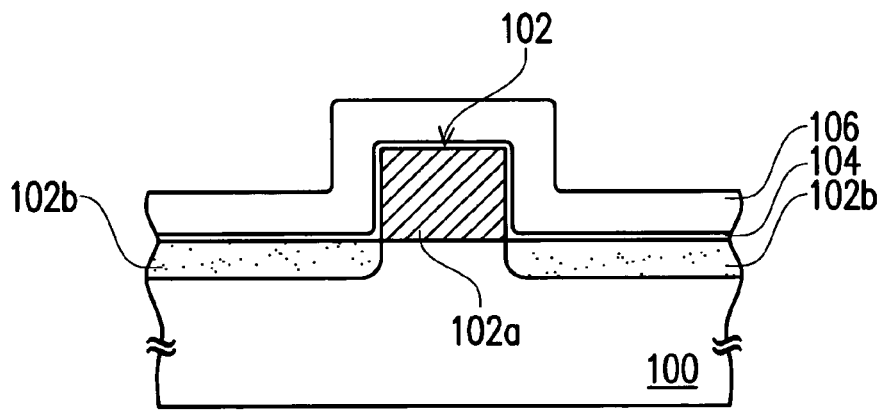

Referring to FIG. 1B, a spacer material layer 106 is formed over the substrate 100 to cover the entire substrate 100 and the device structure 102. The spacer material layer 106 is fabricated using silicon nitride and is formed by performing a chemical vapor deposition process, for example. In one embodiment, before forming the spacer material layer 106, a silicon oxide layer 104 is also formed over the substrate 100 and the device structure 102, for example, by performing a thermal oxidation process. The silicon oxide layer 104 serves as an etching stop layer in a subsequent spacer etching process.

Figure 1C:
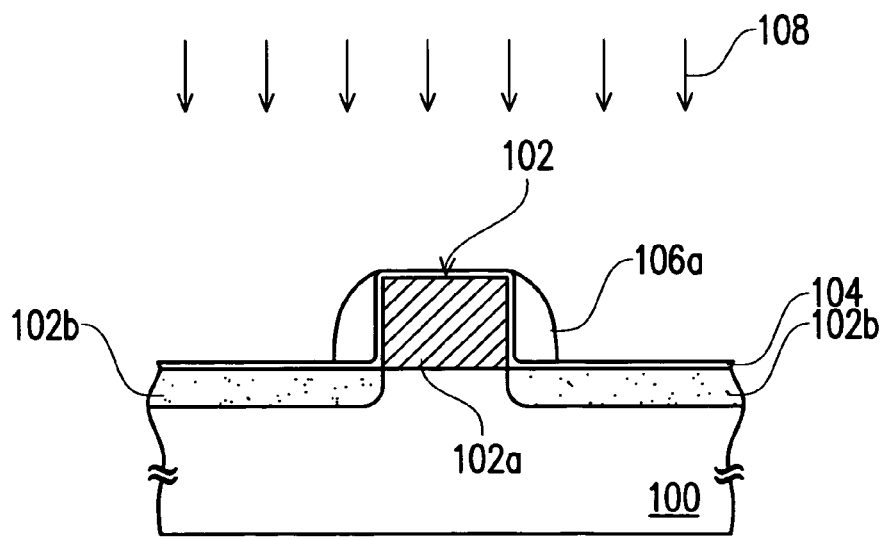

Referring to FIG. 1C, an etching process 108 is performed to remove a portion of the spacer material layer 106 so as to form spacers 106a on the sidewalls of the gate structure 102a. The etching process 108 is an anisotropic etching process using a gaseous etchant including carbon hexafluoride/carbon dioxide/fluoromethane ($C_2F_6/CO_2/CH_3F$) or other suitable etchant, for example. However, in the etching process 108, unexpected polymer byproducts may also form on the sidewalls of the spacers 106a due to the presence of organic compounds in the gaseous etchant.

Figure 1D:
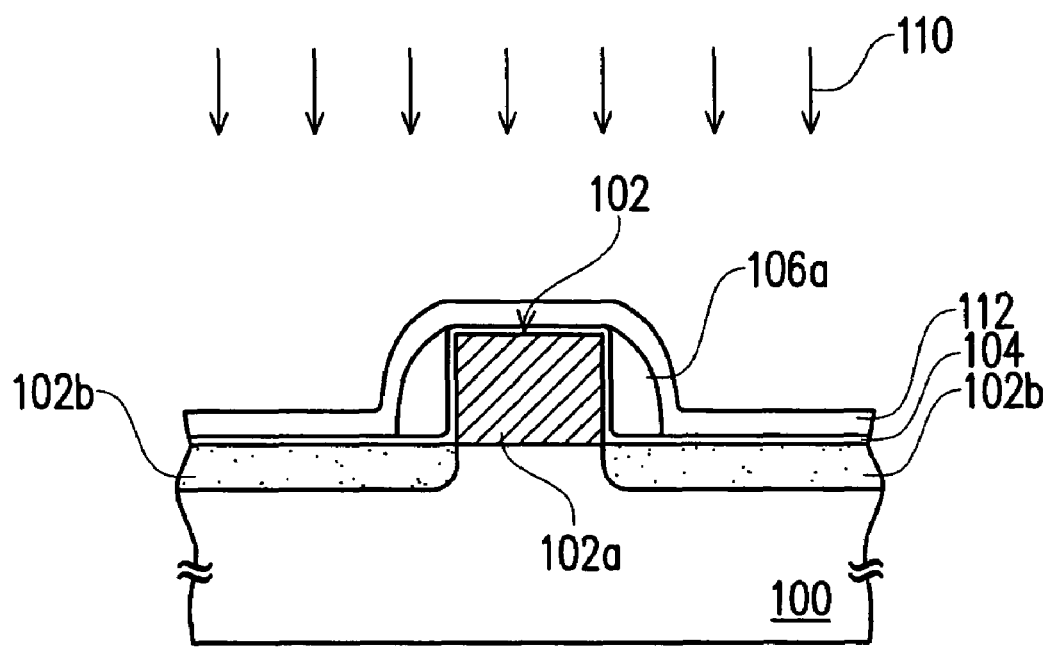

Referring to FIG. 1D, after performing the etching process 108 but before performing a cleaning step, a plasma treatment step 110 is performed to form a spacer protection layer 112 on the surface of the substrate 100, the spacers 106a and the device structure 102. The spacer protection layer 112 for protecting the spacers 106a is, for example, an oxide layer. The operation parameters for performing the plasma treatment step 110 includes, for example, a pressure of about 50 mtorr, a power of about 600W, a gas flow rate of the reactive gases below 8000 sccm, preferably around 180 sccm, and a reaction time between 20 to 40 seconds. In the plasma treatment step 110, the reactive gas is an oxygen-containing gaseous mixture comprising, for example, oxygen and one other gas selected from a group consisting of nitrogen ($N_2$), argon (Ar), neon (Ne) and helium (He).

In one embodiment, the aforementioned etching process 108 and plasma treatment step 110 can be performed with in-situ. In other words, both processes can be performed in the same reaction chamber. In another embodiment, the etching process 108 and the plasma treatment step 110 can be performed in different reaction chambers, for example.

In addition, the present invention can be applied to produce offset spacers. For example, after using a conventional process to fabricate offset spacers, a plasma treatment step is performed to form an oxide layer for protecting the offset spacers. Since an identical fabricating method can be used, a detailed description is omitted.

Figure 2:
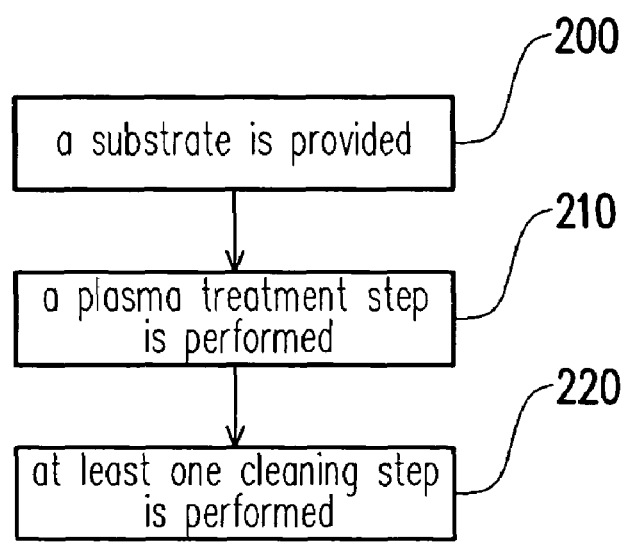
FIG. 2 is a flow diagram showing the steps in a cleaning step after forming spacers in an etching process according to the embodiment of the present invention.

After fabricating the spacers in the present invention, a cleaning step may be performed to remove unexpected polymer residues or micro particles on the spacers 106 deposited during the etching process 108. The following is a detailed description of the post-etching cleaning step. FIG. 2 is a flow diagram showing the steps in a post-etching cleaning step according to the embodiment of the present invention.

In step 200, a substrate having a device structure formed thereon is provided. The device structure comprises a gate structure and a pair of source/drain regions. Furthermore, spacers have already formed on the sidewalls of the gate structure.

In step 210, a plasma treatment step is performed. The plasma treatment step produces a spacer protection layer on the surface of the substrate, the spacers and the device structure.

In step 220, at least one cleaning step is performed to remove any polymer or micro particles attached to the wafer. The solution used in the cleaning step includes, for example, a solution mixture of sulfuric acid ($H_2SO_4$)/hydrogen peroxide ($H_2O_2$)/water ($H_2O$) (standard cleaning solution SPM), a solution mixture of hydrochloric acid (HCl)/hydrogen peroxide ($H_2O_2$)/water ($H_2O$) (standard cleaning solution HPM) or a solution mixture of ammonium water ($NH_4OH$)/hydrogen peroxide ($H_2O_2$)/water ($H_2O$) (standard cleaning solution APM).

In one embodiment, the cleaning step includes dipping the entire substrate, the spacers and the device structure into a tank of SPM cleaning solution. In another embodiment, the cleaning step includes dipping the entire substrate, the spacers and the device structure into a tank of SPM cleaning solution and dipping the same into a tank of APM cleaning solution. Obviously, there is no particular restriction on the number of cleaning steps and the types of cleaning solutions used in the present invention.

It should be noted that one of the major characteristics of the present invention is the formation of a spacer protection layer to protect the spacers by performing a plasma treatment step after the etching process. In the subsequent cleaning step, the present of the spacer protection layer over the spacers also prevents the cleaning solution from harming the spacers. In other words, the problems of damaging the surface of the spacers or reducing the thickness of the spacers after the cleaning step can be avoided. In particular, because of the formation of a spacer protection layer in a plasma treatment step after the etching process, the spacers are protected against the corrosive effect of the cleaning solution. Consequently, the queuing time (Q-time) of the cleaning step is increased so that some production cost is saved. The Q-time of the cleaning step refers to the period after the spacer etching and the plasma treatment step to the time before performing the cleaning step.

In the following, a semiconductor device structure according to the present invention is described. The semiconductor device structure as shown in FIG. 1D comprises a device structure 102, a plurality of spacers 105a and a spacer protection layer 112. The device structure 102 further comprises a gate structure 102a and a pair of source/drain regions 102b. The gate structure 102a is disposed on the substrate 100 and the source/drain regions 102b are disposed in the substrate 100 on the respective side of the gate structure 102a. The spacers 106a are disposed on the respective sidewalls of the gate structure 102a. The spacers 106a are fabricated using silicon nitride, for example. Furthermore, the spacer protection layer 112 is disposed on the surface of the substrate 100, the spacers 106a and the device structure 102. The spacer protection layer 112 is an oxide layer, for example. In particular, the spacer protection layer 112 is formed in a plasma treatment step for protecting the spacers 106a against possible surface damages and thickness attrition resulting from an attack by the corrosive solution used in a cleaning step.

In summary, the major advantages of the present invention at least include:
1. By forming a spacer protection layer over the spacers to protect the spacers against corrosive cleaning solution, the problems of having a damaged spacer surface or a reduction in thickness of the spacer are eliminated.
2. The performance of a plasma treatment step after the spacer etching process but before the cleaning step resolves the problem of having difficulties controlling the width of the spacers.
3. The queuing time for the cleaning step can be increased to save production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating spacers, comprising the steps of:
providing a substrate having a device structure formed thereon, wherein the device structure comprises a gate structure and a pair of source/drain regions;
forming a spacer material layer over the substrate to cover the substrate and the device structure;
performing an etching process to remove a portion of the spacer material layer so that spacers are formed on the sidewalls of the gate structure;
performing, after the etching process, a plasma treatment step to form a spacer protection layer on the surface of the substrate, the spacers and the device structure; and
performing, after the plasma treatment step, at least one cleaning step on the substrate, wherein the spacer protection layer protects the spacers in the at least one cleaning step, wherein the etching process and the plasma treatment step are performed with in-situ.

2. The method of fabricating spacers of claim 1, wherein the reactive gas used in the plasma treatment step includes an oxygen-containing gas.

3. The method of fabricating spacers of claim 2, wherein the oxygen-containing gas includes oxygen and another gas selected from a group consisting of nitrogen ($N_2$), argon (Ar), neon (Ne) and helium (He).

4. The method of fabricating spacers of claim 1, wherein the reaction time in the plasma treatment step is between 20 to 40 seconds.

5. The method of fabricating spacers of claim 1, wherein the spacer protection layer includes an oxide layer.

6. The method of fabricating spacers of claim 1, wherein the gaseous etchant used in the etching process includes carbon hexafluoride/carbon dioxide/fluoromethane ($C_2F_6/CO_2/CH_3F$).

7. The method of fabricating spacers of claim 1, wherein the material of the spacer material layer includes silicon nitride.

8. A cleaning method after an offset spacer etching process, comprising the steps of:
providing a substrate having a device structure formed thereon, wherein the device structure comprises a gate structure;
forming offset spacers on the respective sidewalls of the gate structures by the offset spacer etching process;
performing, after the offset spacer etching process, a plasma treatment step to form an offset spacer protection layer on the surface of the substrate, the offset spacers and the device structure;
performing, after the plasma treatment step, at least one cleaning step on the substrate, wherein the offset spacer protection layer protects the offset spacers in the at least one cleaning step and the etching process to form the offset spacers and the plasma treatment step are performed in the same reaction chamber; and
forming spacers on the offset spacers by an spacer etching process.

9. The cleaning method after an offset spacer etching process of claim 8, wherein the reactive gas used in the plasma treatment step includes an oxygen-containing gas.

10. The cleaning method after an offset spacer etching process of claim 9, wherein the oxygen-containing gas comprises oxygen and another gas selected from a group consisting of nitrogen, argon, neon and helium.

11. The cleaning method after an offset spacer etching process of claim 8, wherein the reaction time in the plasma treatment step is between 20 to 40 seconds.

12. The cleaning method after an offset spacer etching process of claim 8, wherein the offset spacer protection layer includes an oxide layer.

13. The cleaning method after an offset spacer etching process of claim 8, wherein the gaseous etchant used in the etching process includes carbon hexafluoride/carbon dioxide/fluoromethane.

14. The cleaning method after an offset spacer etching process of claim 8, wherein the material of the spacers includes silicon nitride.

15. The cleaning method after an offset spacer etching process of claim 8, wherein the cleaning solution used in the cleaning step includes a solution mixture of sulfuric acid ($H_2SO_4$)/hydrogen peroxide ($H_2O_2$)/water ($H_2O$) (standard cleaning solution SPM), a solution mixture of hydrochloric acid (HCl)/hydrogen peroxide ($H_2O_2$)/water ($H_2O$) (standard cleaning solution HPM) or a solution mixture of ammonium water ($NH_4OH$)/hydrogen peroxide ($H_2O_2$)/water ($H_2O$) (standard cleaning solution APM).

* * * * *